United States Patent [19]

Kuzuhara

[11] Patent Number: 5,504,353
[45] Date of Patent: Apr. 2, 1996

[54] FIELD EFFECT TRANSISTOR

[75] Inventor: Masaaki Kuzuhara, Tokyo, Japan

[73] Assignee: NEC Corporation, Japan

[21] Appl. No.: 461,025

[22] Filed: Jun. 5, 1995

[30] Foreign Application Priority Data

Jun. 6, 1994 [JP] Japan .................................. 6-123421

[51] Int. Cl.$^6$ .............................................. H01L 31/0328
[52] U.S. Cl. ......................... 257/194; 257/284; 257/615; 257/745
[58] Field of Search .................................... 257/194, 284, 257/615, 745, 622, 655

[56] References Cited

U.S. PATENT DOCUMENTS 5,313,093  5/1994  Nakagawa ................. 257/194

FOREIGN PATENT DOCUMENTS

| 60-86872 | 5/1985 | Japan | H01L 29/80 |
| 62-252975 | 11/1987 | Japan | H01L 29/80 |
| 63-228763 | 9/1988 | Japan | H01L 29/80 |
| 4-199641 | 7/1992 | Japan | H01L 21/338 |

OTHER PUBLICATIONS

"Super Low–Noise GaAs MESFET's with a Deep–Recess Structure"; IEE Transactions on Electron Devices, vol. ED–27; No. 6; Jun. 1990; pp. 1029–1034.

Huang, J. C., et al; "An AlGaAs/InGaAs Pseudomorphic High Electron . . . " IEEE MTT–S Digest, pp. 713–716, 1991.

Takikawa, M., et al; "Pseudomorphic N–InGaP/InGaAs/GaAs High . . . " IEEE Electron Device Letters, vol. 14, No. 6, Aug. 1993.

*Primary Examiner*—Mark V. Prenty
*Attorney, Agent, or Firm*—Hayes, Soloway, Hennessey, Grossman & Hage

[57]  ABSTRACT

A buffer layer 2 composed of undoped GaAs or undoped AlGaAs, an n-type AlGaAs electron supply layer 3, an undoped InGaAs channel layer 4, an AlGaAs electron supply layer 5 composed of n-type AlGaAs or undoped AlGaAs, an n-type InGaP contact lower layer 16, and an n-type GaAs contact upper layer 7 are formed on a semiinsulating GaAs substrate 1. A gate electrode is formed on the AlGaAs electron supply layer 5. A drain electrode and a source electrode are formed on the GaAs contact upper layer 7. Thus, in the FET with double-recess structure, the drain current can be increased and the gate breakdown voltage can be improved.

16 Claims, 3 Drawing Sheets

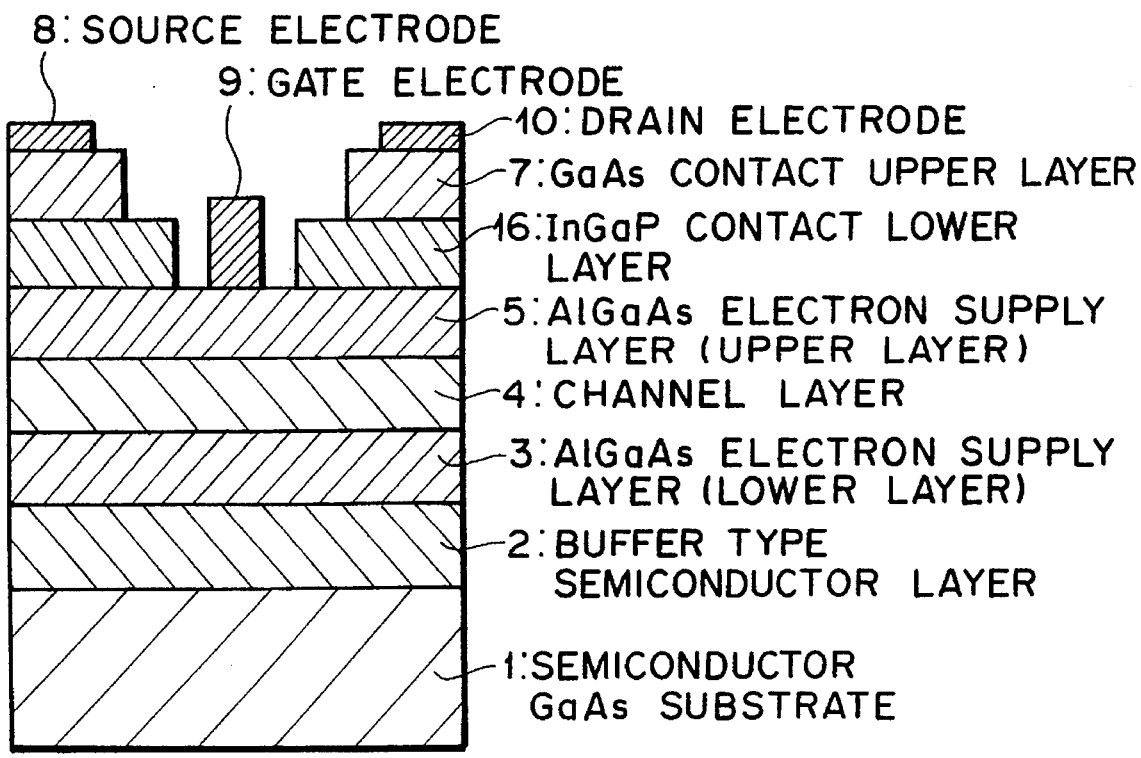

FIG.1

- 8: SOURCE ELECTRODE
- 9: GATE ELECTRODE
- 10: DRAIN ELECTRODE
- 7: GaAs CONTACT UPPER LAYER
- 16: InGaP CONTACT LOWER LAYER
- 5: AlGaAs ELECTRON SUPPLY LAYER (UPPER LAYER)
- 4: CHANNEL LAYER
- 3: AlGaAs ELECTRON SUPPLY LAYER (LOWER LAYER)
- 2: BUFFER TYPE SEMICONDUCTOR LAYER
- 1: SEMICONDUCTOR GaAs SUBSTRATE

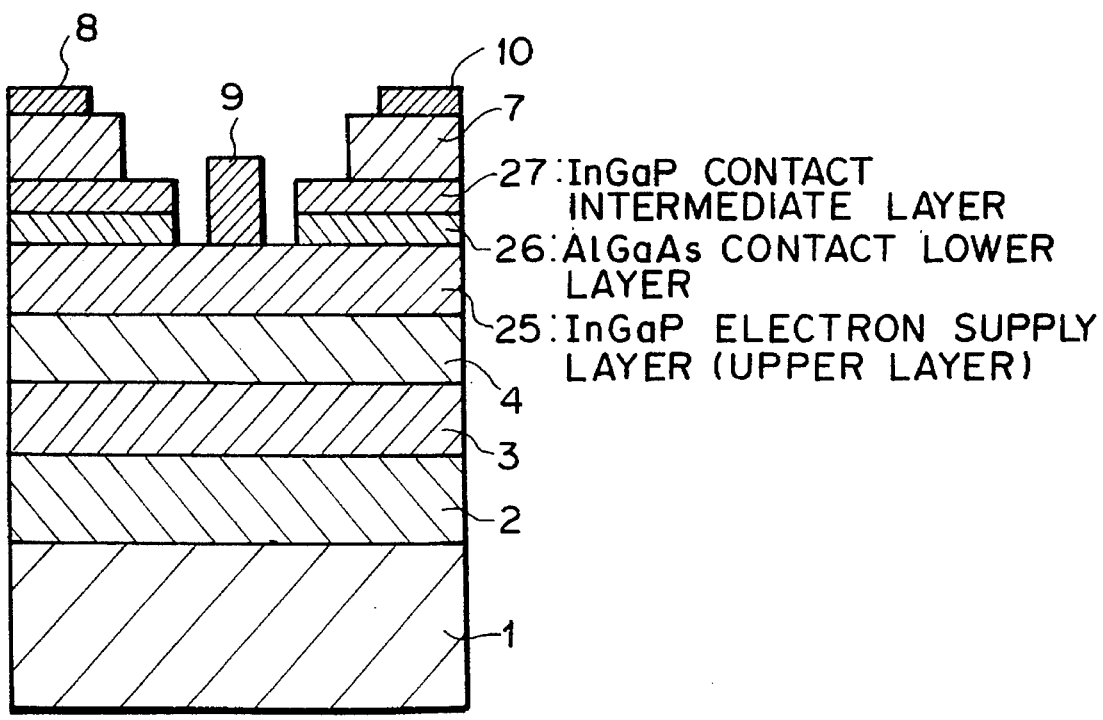

FIG.2

- 27: InGaP CONTACT INTERMEDIATE LAYER
- 26: AlGaAs CONTACT LOWER LAYER
- 25: InGaP ELECTRON SUPPLY LAYER (UPPER LAYER)

- 27: InGaP CONTACT INTERMEDIATE LAYER
- 26: AlGaAs CONTACT LOWER LAYER
- 35: AlGaInP ELECTRON SUPPLY LAYER (UPPER LAYER)

- 27: InGaP CONTACT INTERMEDIATE LAYER
- 26: AlGaAs CONTACT LOWER LAYER
- 52: InGaP ELECTRON SUPPLY LAYER (UPPER LAYER 2)
- 51: AlGaAs ELECTRON SUPPLY LAYER (UPPER LAYER 1)

FIELD EFFECT TRANSISTOR

BACKGROUND OF THE INVENTION

1. Field of the Invention

The present invention relates to a field effect transistor, in particular, to a field effect transistor that is formed on a GaAs substrate and that has excellent fabrication capability such as uniformity and reproducibility at a manufacturing operation.

2. Description of the Related Art

In recent years, a heterojunction type field effect transistor (FET) using excellent mobility characteristics of electron gas formed at a selectively-doped heterojunction interface has become attractive as a fundamental device of each communication equipment used in a microwave band and a millimeter-wave band and a fundamental device of an ultra high speed digital integrated circuit. In the heterojunction type FET, for example an undoped GaAs layer and an n-type AlGaAs layer doped with donor impurities are formed on a semiinsulating GaAs substrate so as to provide a heterojunction. When electrons are transitted from the n-type AlGaAs layer (referred to as the electron supply layer) to the undoped GaAs layer (referred to the channel layer), electrons are confined in the vicinity of the heterojunction interface. The two-dimensional electrons function as a channel. When the concentration of the two-dimensional electrons is controlled with a voltage applied to the gate electrode, the conductance between the source and drain can be controlled.

In the heterojunction FET, with a double-recess structure, both high voltage operation and large current operation can be achieved at the same time as disclosed in Huang et al., "An AlGaAs/InGaAs Pseudomorphic High Electron Mobility Transistor (PHEMT) For X- and Ku-band Power Applications", 1991 IEEE MTT-S International Microwave Symposium Digest, pp 713-716. FIG. 5 is a sectional view showing a principal portion of such a heterojunction type FET. In FIG. 5, reference numeral 1 is a semiinsulating GaAs substrate. Reference numeral 2 is a buffer type semiconductor layer that is composed of GaAs or AlGaAs or heterojunction type thereof that is not intentionally doped with n-type impurities or p-type impurities or doped therewith at satisfactorily low concentration. Reference numeral 3 is an AlGaAs electron supply layer (lower layer) doped with n-type impurities entirely or locally in the direction of the thickness thereof. Reference numeral 4 is a channel layer composed of for example GaAs or InGaAs that is not intentionally doped with n-type impurities or p-type impurities or that is doped therewith at satisfactorily low concentration. Reference numeral 5 is an AlGaAs electron supply layer (upper layer) that is intentionally doped with n-type impurities entirely or locally in the direction of the thickness thereof. Reference numeral 6 is a GaAs contact lower layer that is doped with n-type impurities. Reference numeral 7 is a GaAs contact upper layer that is doped with n-type impurities at high concentration. Reference numeral 8 is a source electrode. Reference numeral 9 is a gate electrode. Reference numeral 10 is a drain electrode.

The characteristics of the heterojunction type field effect transistor with the conventional structure depend on the width (w1) of a wide recess opening portion formed by etching out the GaAs contact upper layer 7, the depth (d1) of the recess thereof, the width (w2) of a narrow recess opening portion formed by etching out the GaAs contact lower layer 6, the depth (d2) of the recess thereof, and the donor concentrations (n1 and n2) of the GaAs contact upper layer 7 and the GaAs contact lower layer 6.

In the heterojunction type semiconductor layer composed of a compound semiconductor layer containing arsenic (As) and another compound semiconductor layer containing phosphorus (P), when a selective etching property using different etching solutions is employed, a Schottky barrier type field effect transistor (MESFET) with small fluctuation of drain saturated current can be accomplished as disclosed by Shoji Ohmura, Japanese Patent Laid-Open Publication 4-199641.

In the conventional field effect transistor using the heterojunction of the n-type AlGaAs layer and GaAs layer (or InGaAs layer), since the doping concentration of n-type AlGaAs is limited by the presence of deep levels, the concentration of the two-dimensional electrons is low. In addition, the threshold voltage largely depends on the temperature characteristics of electron distribution probability in the deep level. Masahiko Takigawa, Japanese Patent Laid-Open Publication 60-86872 and Tatsuya Ohbori et. al, Japanese Patent Laid-Open Publication 63-228763 disclose that such problems can be solved by a field effect transistor that employs the heterojunction of an n-type InGaP layer and a GaAs layer or a field effect transistor that employs the heterojunction of an n-type InGaP layer and an InGaAs layer.

In the process for fabricating the conventional double-recess structure heterojunction type field effect transistor shown in FIG. 5, the width (w1) of the wide recess opening portion, the depth (d1) of the recess thereof, the width (w2) of the narrow recess opening portion, and the depth (d2) of the recess thereof should be precisely adjusted and processed for the manufacturing. The control of the widths (w1 and w2) of the recess opening portions can be improved to some extent by the use of highly accurate lithography technology. However, when AlGaAs/GaAs are used as semiconductor materials, it is very difficult to accurately control the depths (d1 and d2) of the recesses. When AlGaAs of which the composition of Al is 0.3 or less and GaAs (or InGaAs) are etched out with different etching solutions, there is no satisfactory difference between the etching speeds. Thus, to control the etching depths of the recesses, the etching time should precisely be controlled. However, deterioration, improper composition control, and improper temperature control of the etching solution, and change of wet state of the etching solutions on the wafer surface adversely affect the accurate control of the etching depths of the recesses. Thus, the nonuniform etching in the double-recess structure occurs largely, leading to the nonuniform distribution in the characteristics (such as transconductance and gate breakdown voltage) of individual transistors on the wafer surface. Consequently, in the conventional transistor structure composed of materials of AlGaAs/GaAs, the double-recess structure cannot be stably provided for large volume fabrication.

SUMMARY OF THE INVENTION

An object of the present invention is to provide an apparatus which a field effect transistor has a double-recess structure which is precisely etched and is stably fabricated.

A first aspect of the present invention is a field effect transistor, comprising a first semiconductor layer composed of GaAs or InGaAs that is intentionally undoped with impurities or that is doped with impurities at satisfactorily low concentration, a second semiconductor layer that is in contact with the first semiconductor layer and that is composed of AlGaAs doped with n-type impurities entirely or locally in the direction of the thickness thereof, a third semiconductor layer that is in contact with the second semiconductor layer and that is composed of InGaP doped with n-type impurities, a fourth semiconductor layer that is in contact with the third semiconductor layer and that is composed of GaAs doped with n-type impurities, a first recess opening portion that pierces through the fourth semiconductor layer, a second recess opening portion that is formed in the first recess opening portion and that pierces through the third semiconductor layer, a gate electrode formed on the surface of the second semiconductor layer exposed at the bottom of the second recess opening portion, and a source electrode and a drain electrode that are formed on the fourth semiconductor layer and that are spaced apart by the first recess opening portion.

A second aspect of the present invention is the field effect transistor of the first aspect, wherein the concentration of the n-type impurities doped in the third semiconductor layer is lower than the concentration of the n-type impurities doped in the fourth semiconductor layer.

A third aspect of the present invention is a field effect transistor, comprising a first semiconductor layer composed of GaAs or InGaAs that is intentionally undoped with impurities or that is doped with impurities at satisfactorily low concentration, a second semiconductor layer that is in contact with the first semiconductor layer and that is composed of InGaP doped with n-type impurities entirely or locally in the direction of the thickness thereof, a third semiconductor layer that is in contact with the second semiconductor layer and that is composed of AlGaAs doped with n-type impurities, a fourth semiconductor layer that is in contact with the third semiconductor layer and that is composed of InGaP doped with n-type impurities, a fifth semiconductor layer that is in contact with the fourth semiconductor layer and that is composed of GaAs doped with n-type impurities, a first recess opening portion that pierces through the fifth semiconductor layer, a second recess opening portion that is formed in the first recess opening portion and that pierces through the fourth semiconductor layer and the third semiconductor layer, a gate electrode formed on the surface of the second semiconductor layer exposed at the bottom of the second recess opening portion, and a source electrode and a drain electrode that are formed on the fifth semiconductor layer and that are spaced apart by the first recess opening portion.

A fourth aspect of the present invention is the field effect transistor of the third aspect, wherein the concentration of the n-type impurities doped in each of the third semiconductor layer and the fourth semiconductor layer is lower than the concentration of the n-type impurities doped in the fifth semiconductor layer.

A fifth aspect of the present invention is a field effect transistor, comprising a first semiconductor layer composed of GaAs or InGaAs that is intentionally undoped with impurities or that is doped with impurities at satisfactorily low concentration, a second semiconductor layer that is in contact with the first semiconductor layer and that is composed of AlGaInP doped with n-type impurities entirely or locally in the direction of the thickness thereof, a third semiconductor layer that is in contact with the second semiconductor layer and that is composed of AlGaAs doped with n-type impurities, a fourth semiconductor layer that is in contact with the third semiconductor layer and that is composed of InGaP doped with n-type impurities, a fifth semiconductor layer that is in contact with the fourth semiconductor layer and that is composed of GaAs doped with n-type impurities, a first recess opening portion that pierces through the fifth semiconductor layer, a second recess opening portion that is formed in the first recess opening portion and that pierces through the fourth semiconductor layer and the third semiconductor layer, a gate electrode formed on the surface of the second semiconductor layer exposed at the bottom of the second recess opening portion, and a source electrode and a drain electrode that are formed on the fifth semiconductor layer and that are spaced apart by the first recess opening portion.

A sixth aspect of the present invention is the field effect transistor of the fifth aspect, wherein the concentration of the n-type impurities doped in each of the third semiconductor layer and the fourth semiconductor layer is lower than the concentration of the n-type impurities doped in the fifth semiconductor layer.

A seventh aspect of the present invention is a field effect transistor, comprising a first semiconductor layer composed of GaAs or InGaAs that is intentionally undoped with impurities or that is doped with impurities at satisfactorily low concentration, a second semiconductor layer that is in contact with the first semiconductor layer and that is composed of AlGaAs doped with n-type impurities entirely or locally in the direction of the thickness thereof, a third semiconductor layer that is in contact with the second semiconductor layer and that is composed of InGaP doped with n-type impurities, a fourth semiconductor layer that is in contact with the third semiconductor layer and that is composed of AlGaAs doped with n-type impurities, a fifth semiconductor layer that is in contact with the fourth semiconductor layer and that is composed of InGaP doped with n-type impurities, a sixth semiconductor layer that is in contact with the fifth semiconductor layer and that is composed of GaAs doped with n-type impurities, a first recess opening portion that pierces through the sixth semiconductor layer, a second recess opening portion that is formed in the first recess opening portion and that pierces through the fifth semiconductor layer and the fourth semiconductor layer, a gate electrode formed on the surface of the third semiconductor layer exposed at the bottom of the second recess opening portion, and a source electrode and a drain electrode that are formed on the sixth semiconductor layer and that are spaced apart by the first recess opening portion.

An eighth aspect of the present invention is the field effect transistor of the seventh aspect, wherein the concentration of the n-type impurities doped in each of the fourth semiconductor layer and the fifth semiconductor layer is lower than the concentration of the n-type impurities doped in the sixth semiconductor layer.

A ninth aspect of the present invention is the field effect transistor of the first, third, fifth, or seventh aspect, wherein the first recess opening portion is formed by a first etching solution that is of a $H_2SO_4—H_2O_2—H_2O$ type and the second recess opening portiois formed by a second etching solution is of a $HCl—H_2O$ type.

A tenth aspect of the present invention is the field effect transistor of the first, third, fifth, or seventh aspect, wherein the source electrode and the drain electrode are formed on the upper surface of the GaAs contact layer and ohmic contacts at the source electrode and the drain electrode are formed by heat treatment.

Since the field effect transistor according to the present invention is composed of a lamination of GaAs, AlGaAs, and InGaAs that are compound semiconductor materials containing As and InGaP or AlGaInP that is a compound semiconductor material containing P, the excellent etching technologies for these semiconductor materials can be used. Thus, a double-recess structure heterojunction type field effect transistor with high performance, uniform, and reproducibility can be accomplished.

The GaAs and InGaP layers are formed in succession as contact layers for the source electrode and the drain electrode after the double-recess structure is formed, and the gate electrode is formed on the AlGaAs layer that is etched out as a recess opening portion and exposed to the surface of the structure. Thus, a high Schottky barrier height (approximately, 1 eV) can be obtained. In addition, since the concentration of the n-type impurities doped in InGaP is lower than the concentration of the n-type impurities doped in GaAs, the gate breakdown voltage can be improved without deterioration of ohmic contact resistance.

Alternatively, the first GaAs layer, the first InGaP layer, and the first AlGaAs layers are formed in succession as contact layers for the source electrode and the drain electrode after the double-recess structure is formed, and the gate electrode is formed on the second InGaP layer (or AlGaInP) layer that is etched out as a recess opening portion and exposed to the surface of the structure. Thus, a field effect transistor with relatively lower surface trap concentration and thus stable surface condition can be accomplished. In addition, since the concentration of the n-type impurities doped in each of the first InGaP layer and the first AlGaAs is lower than the concentration of the n-type impurities doped in the first GaAs layer, the gate breakdown voltage can be improved without deterioration of ohmic contact resistance.

According to the present invention, the selective etching technologies can be used. Thus, the control of the process and the corresponding process time needed can be remarkably improved without necessity of the skills of engineers. Moreover, in the double-recess structure of laminated contact structure, the concentration of n-type impurities doped in the contact layer can be optimally selected. Thus, both the increase in the drain current and the improvement in the gate breakdown voltage can be accomplished at the same time. In other words, according to the present invention, the high performance of the double-recess structure heterojunction type field effect transistor and the improvement in the productivity thereof can be accomplished at the same time.

These and other objects, features and advantages of the present invention will become more apparent in light of the following detailed description of best mode embodiments thereof, as illustrated in the accompanying drawings.

BRIEF DESCRIPTION OF THE DRAWINGS

FIG. 1 is a sectional view showing the structure of a field effect transistor according to a first embodiment of the present invention;

FIG. 2 is a sectional view showing the structure of a field effect transistor according to a second embodiment of the present invention;

Figure 3:
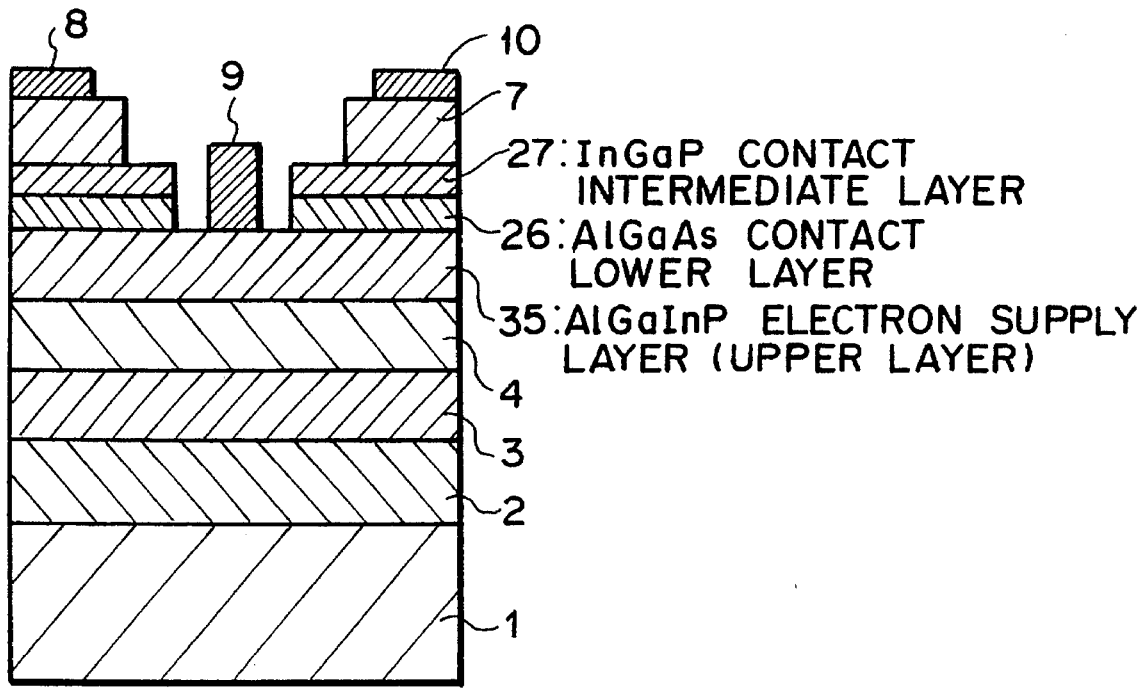
FIG. 3 is a sectional view showing the structure of a field effect transistor according to a third embodiment of the present invention.

DESCRIPTION OF THE PREFERRED EMBODIMENTS ( First Embodiment )

FIG. 1 is a sectional view showing the structure of a field effect transistor according to a first embodiment of the present invention. In FIG. 1, reference numeral 1 is a semiinsulating GaAs substrate. Reference numeral 2 is a buffer type semiconductor layer that is composed of for example GaAs or AlGaAs or heterojunction type thereof that is not intentionally doped with n-type impurities or p-type impurities or doped therewith at satisfactorily low concentration. Reference numeral 3 is an AlGaAs electron supply layer (lower layer) doped with n-type impurities entirely or locally in the direction of the thickness thereof. Reference numeral 4 is a channel layer composed of for example GaAs or InGaAs that is not intentionally doped with n-type impurities or p-type impurities or that is doped therewith at satisfactorily low concentration. Reference numeral 5 is an AlGaAs electron supply layer (upper layer) that is intentionally doped with n-type impurities entirely or locally in the direction of the thickness thereof. Reference numeral 16 is a InGaP contract lower layer that is doped with n-type impurities. Reference numeral 7 is a GaAs contact upper layer that is doped with n-type impurities at high concentration. The composition x of In of the $In_xGa_{1-x}P$ contact lower layer may be 0.49 that matches with the lattice of the semiinsulating GaAs substrate 1. However, the composition x is not limited to such a value. The impurities may be equally doped in the AlGaAs electron supply layer (upper layer) 5 and the AlGaAs electron supply layer (lower layer) 3 as an impurity profile. However, the present invention is not limited to such an impurity profile. Instead, the impurities doped in the AlGaAs electron supply layer (upper layer) 5 and the AlGaAs electron supply layer (lower layer) 3 may be varied by inclination or step shape in the direction of the depth. Alternatively, the impurities may be planar-doped.

Such a field effect transistor can be fabricated in the following manner. By for example metal organic vapor phase epitaxial growth method (MOVPE), an undoped GaAs layer as a buffer type semiconductor layer 2 for 300 nm, an undoped $Al_{0.2}Ga_{0.8}As$ layer for 200 nm, an n-type $Al_{0.2}Ga_{0.8}As$ electron supply layer (lower layer) 3 doped with Si of approximately $2.5 \times 10^{18}$ $cm^{-3}$ for 6 nm, an undoped $Al_{0.2}Ga_{0.8}As$ spacer layer for 1.5 nm, an undoped $In_{0.2}Ga_{0.8}As$ channel layer 4 for 13 nm, an undoped $Al_{0.2}Ga_{0.8}As$ spacer layer for 1.5 nm, an n-type $Al_{0.2}Ga_{0.8}As$ layer doped with Si of approximately $2.5 \times 10^{18}$ $cm^{-3}$ for 14 nm (as an AlGaAs electron supply layer (upper layer)5), an undoped $Al_{0.2}Ga_{0.8}As$ (Schottky) layer for 20 nm, an n-type $In_{0.49}Ga_{0.51}P$ contact lower layer 16 doped with Si of approximately $2 \times 10^{17}$ $cm^{-3}$ for 40 nm, and an n-type GaAs contact upper layer 7 doped with Si of $3 \times 10^{18}$ $cm^{-3}$ for 80 nm are grown on a semiinsulating GaAs substrate in succession. In this case, even if the two undoped $Al_{0.2}Ga_{0.8}As$ spacer layers that are spaced apart by the undoped $In_{0.2}Ga_{0.8}As$ channel layer are omitted, the fundamental operation of the FET not affected In addition the undoped $Al_{0.2}Ga_{0.8}As$ (Schottky) layer formed as a part of the n-type $Al_{0.2}Ga_{0.8}As$ electron supply layer (upper layer) improves the breakdown voltage of the gate electrode.

Thereafter, the portion other than the first opening recess portion is masked and the n-type GaAs contact upper layer 7 is etched out with for example a $H_2SO_4$—$H_2O_2$—$H_2O$ type etching solution as a first etching solution so as to form the first recess opening portion. At this point, since the InGaP layer 16 is hardly etched out with the etching solution, when the surface of the n-type $In_{0.49}Ga_{0.51}P$ contact lower layer 16 is exposed, the etching in the direction of the depth of the recess opening portion that pierces through the n-type GaAs contact upper layer is automatically stopped. Thereafter, the portion other than the second opening portion is masked and the inside of the first recess opening portion is etched out with for example a $HCl$—$H_2O$ type etching solution as a second etching solution so as to form a second recess opening portion that is narrower than the first recess opening portion.

At this point, since the GaAs layer 7 or the AlGaAs layer 5 is hardly etched out with this etching solution, when the surface of the undoped $Al_{0.2}Ga_{0.8}As$ (Schottky) layer is exposed, the etching in the direction of the depth of the second recess opening portion that pierces through the n-type $In_{0.49}Ga_{0.51}P$ contact lower layer is automatically stopped. Thereafter, a gate electrode 9 composed of for example aluminum (Al) is formed on the surface of the undoped $Al_{0.2}Ga_{0.8}As$ (Schottky) layer 5 exposed at the bottom of the second recess opening portion.

Last, a source electrode and a drain electrode that are composed of for example gold germanium/nickel (AuGe/Ni) are formed on the two surface portions of the n-type GaAs contact upper layer 7 that are spaced apart by the gate electrode 9 and the first recess opening portion. Thereafter, ohmic contacts are formed by heat treatment at a temperature of approximately 420° C.

Since the field effect transistor according to the first embodiment of the present invention has the double-recess structure, it provides both a high gate breakdown voltage and large maximum drain current at the same time. In addition, since the field effect transistor according to the first embodiment has a higher process tolerance than the conventional field effect transistor shown in FIG. 5, the productivity and yield of the device can be remarkably improved. Thus, the field effect transistor according to the first embodiment can be widely used in a variety of applications from analog applications to digital applications such as low noise amplifier in microwave band and millimeter-wave band, wide band linear amplifier, high power amplifier, and oscillator for x- and ku-band operation.

(Second Embodiment)

FIG. 2 is a sectional view showing the structure of a field effect transistor according to a second embodiment of the present invention. For simplicity, in FIG. 2, similar portions to those in FIG. 1 are denoted by similar reference numerals and the description thereof is omitted. The field effect transistor according to the second embodiment of the present invention (shown in FIG. 2) has the same structure as the field effect transistor according to the first embodiment of the present invention (shown in FIG. 1) except for the following points.

In the second embodiment, an InGaP electron supply layer (upper layer) 25 doped with n-type impurities entirely or locally in the direction of the thickness thereof is formed instead of the AlGaAs electron supply layer (upper layer) 5. In addition, a laminate structure of an InGaP contact intermediate layer 27 doped with n-type impurities and an AlGaAs contact lower layer 26 doped with n-type impurities is formed instead of the InGaP contact lower layer 16. In this case, the InGaP contact intermediate layer 27 is formed in contact with the GaAs contact upper layer 7. The composition x of In of each of the $In_xGa_{1-x}P$ electron supply layer (upper layer) 25 and the $In_xGa_{1-x}P$ contact intermediate layer 27 may be 0.49 that matches with the lattice of the semiinsulating GaAs substrate 1. However, the composition x is not limited to such a value. The impurities may be equally doped in the InGaP electron supply layer (upper layer) 25 and the AlGaAs electron supply layer (lower layer) 3 as an impurity profile in the direction of the depth.

However, the present invention is not limited to such an impurity profile. Instead, the impurities doped in the InGaP electron supply layer (upper layer) 25 and the AlGaAs electron supply layer (lower layer) 3 may be varied by inclination or step shape in the direction of the depth. Alternatively, the impurity concentration profiles may be planar-doped.

Such a field effect transistor can be fabricated in the following manner. By for example metal organic vapor phase epitaxial growth method (MOVPE), an undoped GaAs layer as a buffer type semiconductor layer 2 for 300 nm, an undoped $Al_{0.2}Ga_{0.8}As$ layer for 200 nm, an n-type $Al_{0.2}Ga_{0.8}As$ electron supply layer (lower layer) 3 doped with Si of approximately $2.5 \times 10^- cm^{-3}$ for 6 nm, an undoped $Al_{0.2}Ga_{0.8}As$ spacer layer for 1.5 nm, an undoped $In_{0.2}Ga_{0.8}As$ channel layer 4 for 13 nm, an undoped $In_{0.49}Ga_{0.51}P$ spacer layer for 1.5 nm an n-type $In_{0.49}Ga_{0.51}P$ layer doped with Si of approximately $2.5 \times 10\ cm^{-3}$ (as an InGaP electron supply layer (upper layer) 25) for 14 nm, an undoped $In_{0.49}Ga_{0.51}P$ (Schottky) layer for 20 nm, an n-type $Al_{0.2}Ga_{0.8}As$ contact lower layer 26 doped with Si of approximately $2 \times 10^{17}\ cm^{-3}$ for 20 nm, an n-type $In_{0.49}Ga_{0.51}P$ contact intermediate layer 27 doped with Si of approximately $2 \times 10^{17}\ cm^{-3}$ for 20 nm, and an n-type GaAs contact upper layer 7 doped with Si of approximately $3 \times 10^{18}\ cm^{-3}$ for 80 nm are grown on a semiinsulating GaAs substrate in succession. In this case, even if the undoped $Al_{0.2}Ga_{0.8}As$ spacer layer and the undoped $In_{0.49}Ga_{0.51}P$ spacer layer that are spaced apart by the undoped $In_{0.2}Ga_{0.8}As$ channel layer are omitted, the fundamental operation of the FET is not affected. In addition, the undoped $In_{0.49}Ga_{0.51}P$ (Schottky) layer formed as a part of the InGaP electron supply layer (upper layer) 25 improves the breakdown voltage of the gate electrode.

Thereafter, the portion other than the first opening recess portion is masked and the n-type GaAs contact upper layer is etched out with for example a $H_2SO_4$—$H_2O_2$—$H_2O$ type etching solution as a first etching solution so as to form the first recess opening portion. At this point, since the InGaP layer 27 is hardly etched out with the etching solution, when the surface of the n-type $In_{0.49}Ga_{0.51}P$ contact intermediate layer 27 is exposed in the first recess portion, the etching in the direction of the depth of the recess opening portion that pierces through the n-type GaAs contact layer 7 is automatically stopped. Thereafter, the inside of the first recess opening portion is etched out with for example a $HCl$—$H_2O$ type etching solution as a second etching solution so as to form a second recess opening portion that is narrower than the first recess opening portion.

At this point, since the GaAs layer 7 or the AlGaAs layer 26 is hardly etched out with this etching solution, when the surface of the n-type $Al_{0.2}Ga_{0.8}As$ contact lower layer 26 is exposed, the etching in the direction of the depth of the second recess opening portion that pierces through the n-type $In_{0.49}Ga_{0.51}P$ contact intermediate layer is automatically stopped.

Thereafter, the second recess opening portion that pierces through the n-type $Al_{0.2}Ga_{0.8}As$ contact lower layer 26 is continuously etched out with for example a $H_2SO_4$—$H_2O_2$—$H_2O$ type etching solution. At this point, since the InGaP layer 27 is hardly etched out with the etching solution, when the surface of the undoped $In_{0.49}Ga_{0.51}P$ (Schottky) layer 25 is exposed, the etching in the direction of the depth of the recess opening portion that pierces through the n-type $Al_{0.2}Ga_{0.8}As$ contact lower layer 26 is automatically stopped.

Thereafter, a gate electrode composed of for example aluminum (Al) is formed on the surface of the undoped $In_{0.49}Ga_{0.51}P$ (Schottky) layer 25 exposed at the bottom of the second recess opening portion. Last, a source electrode and a drain electrode that are composed of for example gold germanium/nickel (AuGe/Ni) are formed on the two surface portions of the n-type GaAs contact upper layer 7 that are spaced apart by the gate electrode and the first recess opening portion. Thereafter, ohmic contacts are formed by heat treatment at a temperature of approximately 420° C.

Since the field effect transistor according to the second embodiment of the present invention has the double-recess structure, it provides both a high gate breakdown voltage and large maximum drain current at the same time. In addition, since the field effect transistor according to the second embodiment has a higher process tolerance than the conventional field effect transistor shown in FIG. 5, the productivity and yield of the device can be remarkably improved. Thus, the field effect transistor according to the second embodiment can be widely used in a variety of applications from analog applications to digital applications such as low noise amplifier in microwave band and millimeter-wave band, wide band linear amplifier, high power amplifier, and oscillator in x- and ku-band.

Figure 5:
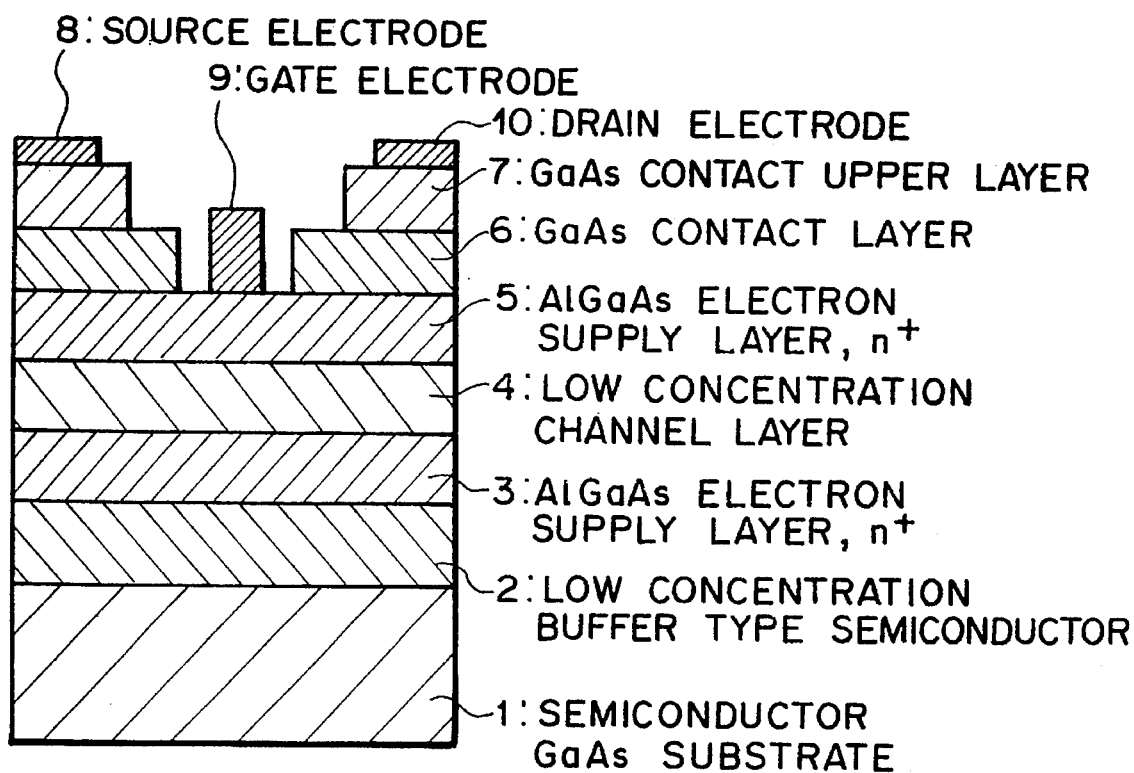
FIG. 5 is a sectional view showing a field effect transistor of a related art reference.

In addition, since the trap concentration on the surface and in the bulk of the InGaP electron supply layer (upper layer) 25 exposed at the bottom of the second recess opening portion is lower than that of the AlGaAs electron supply layer (upper layer) 5 of the conventional field effect transistor shown in FIG. 5, the field effect transistor according to the second embodiment stably operates against external conditions such as temperature change and light radiation.

(Third Embodiment)

FIG. 3 is a sectional view showing the structure of a field effect transistor according to a third embodiment of the present invention. For simplicity, in FIG. 3, similar portions to those in FIG. 1 are denoted by similar reference numerals and the description thereof is omitted. The field effect transistor according to the third embodiment of the present invention (shown in FIG. 3) has the same structure as the field effect transistor according to the first embodiment of the present invention (shown in FIG. 1) except for the following points. In the third embodiment, an AlGaInP electron supply layer (upper layer) 35 doped with n-type impurities entirely or locally in the direction of the thickness thereof is formed instead of the AlGaAs electron supply layer (upper layer) 5.

In addition, a laminate structure of an InGaP contact intermediate layer 27 doped with n-type impurities and an AlGaAs contact lower layer 26 doped with n-type impurities is formed instead of the InGaP contact lower layer 16. In this case, the InGaP contact intermediate layer 27 is formed in contact with the GaAs contact upper layer 7. The composition x of In of each of the $(AlGa)_{1-x}In_xP$ electron supply layer (upper layer) 35 and the $In_xGa_{1-x}P$ contact intermediate layer 27 may be 0.49 that accords with the lattice of the semiinsulating GaAs substrate 1.

However, the composition x is not limited to such a value. The impurities may be equally doped in the AlGaInP electron supply layer (upper layer) 35 and the AlGaAs electron supply layer (lower layer) 3 as an impurity profile in the direction of the depth. However, the present invention is not limited to such an impurity profile. Instead, the impurities doped in the AlGaInP electron supply layer (upper layer) 35 and the AlGaAs electron supply layer (lower layer) 3 may be varied in the direction of the depth or in step shape. Alternatively, the impurity concentration profiles may be planar-doped.

Such a field effect transistor can be fabricated in the following manner. By for example metal organic vapor phase epitaxial growth method (MOVPE), an undoped GaAs layer as a buffer type semiconductor layer 2 for 300 nm, an undoped $Al_{0.2}Ga_{0.8}As$ layer for 200 nm, an n-type $Al_{0.2}Ga_{0.8}As$ electron supply layer (lower layer) 3 doped with Si of approximately $2.5 \times 10^{18}$ $cm^{-3}$ for 6 nm, an undoped $Al_{0.2}Ga_{0.8}As$ spacer layer for approximately 1.5 nm, an undoped $In_{0.2}Ga_{0.8}As$ channel layer 4 for 13 nm, an undoped $(Al_{0.2}Ga_{0.8})_{0.51}In_{0.49}P$ spacer layer for 1.5 nm, an n-type $(Al_{0.2}Ga_{0.8})_{0.51}In_{0.49}P$ layer doped with Si of approximately $2.5 \times 10^{18}$ $cm^{-3}$ (as an AlGaInP electron supply layer (upper layer)) for 14 nm, an undoped $(Al_{0.2}Ga_{0.8})_{0.51}In_{0.49}P$ (Schottky) layer for 20 nm, an n-type $Al_{0.2}Ga_{0.8}As$ contact lower layer doped with Si of approximately $2 \times 10^{17}$ $cm^{-3}$ for 20 nm, an n-type $In_{0.49}Ga_{0.51}P$ contact intermediate layer doped with Si of approximately $2 \times 10^{17}$ $cm^{-3}$ for 20 nm, and an n-type GaAs contact upper layer doped with Si of approximately $3 \times 10^{18}$ $cm^{-3}$ for 80 nm are grown on a semiinsulating GaAs substrate in succession.

In this case, even if the undoped $Al_{0.2}Ga_{0.8}As$ spacer layer and the undoped $(Al_{0.2}Ga_{0.8})_{0.51}In_{0.49}P$ spacer layer that are spaced apart by the undoped $In_{0.2}Ga_{0.8}As$ channel layer are omitted, the fundamental operation of the FET is not affected. In addition, the undoped $(Al_{0.2}Ga_{0.8})_{0.51}In_{0.49}P$ (Schottky) layer formed as a part of the AlGaInP electron supply layer (upper layer) 35 improves the breakdown voltage of the gate electrode 9.

Thereafter, the portion other than the first recess portion is masked and the n-type GaAs contact upper layer is etched out with for example a $H_2SO_4$—$H_2O_2$—$H_2O$ type etching solution so as to form the first recess opening portion. At this point, since the InGaP layer 27 is hardly etched out with the etching solution, when the surface of the n-type $In_{0.49}Ga_{0.51}P$ contact intermediate layer 27 is exposed in the first recess portion, the etching in the direction of the depth of the recess opening portion that pierces through the n-type GaAs contact upper layer 7 is automatically stopped.

Thereafter, the inside of the first recess opening portion is etched out with for example a HCl—$H_2O$ type etching solution so as to form a second recess opening portion that is narrower than the first recess opening portion. At this point, since the GaAs layer 7 or the AlGaAs layer 26 is hardly etched out with this etching solution, when the surface of the n-type $Al_{0.2}Ga_{0.8}As$ contact lower layer 26 is exposed, the etching in the direction of the depth of the second recess opening portion that pierces through the n-type $In_{0.49}Ga_{0.51}P$ contact intermediate layer 27 is automatically stopped. Thereafter, the second recess opening portion that pierces through the n-type $Al_{0.2}Ga_{0.8}As$ contact lower layer 26 is continuously etched out with for example a $H_2SO_4$—$H_2O_2$—$H_2O$ type etching solution.

At this point, since the AlGaInP layer 35 or the InGaP layer 27 is hardly etched out with the etching solution, when the surface of the undoped $(Al_{0.2}Ga_{0.8})_{0.51}In_{0.49}P$ (Schottky) layer 35 is exposed, the etching in the direction of the depth of the recess opening portion that pierces through the n-type $Al_{0.2}Ga_{0.8}As$ contact lower layer 26 is automatically stopped. Thereafter, a gate electrode 9 composed of for example aluminum (Al) is formed on the surface of the undoped $(Al_{0.2}Ga_{0.8})_{0.51}In_{0.49}P$ (Schottky) layer 35 exposed at the bottom of the second recess opening portion. Last, a source electrode 8 and a drain electrode 10 that are composed of for example gold germanium/nickel (AuGe/Ni) are formed on the two surface portions of the n-type GaAs contact upper layer 7 that are spaced apart by the gate electrode and the first recess opening portion. Thereafter, ohmic contacts are formed by heat treatment at a temperature of approximately 420° C.

Since the field effect transistor according to the third embodiment of the present invention has the double-recess structure, it provides both a high gate breakdown voltage and large maximum drain current at the same time. In addition, since the field effect transistor according to the third embodiment has a higher process tolerance than the conventional field effect transistor shown in FIG. 5, the productivity and yield of the device can be remarkably improved. Thus, the field effect transistor according to the third embodiment can be widely used in a variety of applications from analog applications to digital applications such as low noise amplifier in microwave band and millimeter-wave band, wide band linear amplifier, high power amplifier, and oscillator in x- and ku-band.

In addition, since the trap concentration on the surface and in the bulk of the AlGaInP electron supply layer (upper layer) 35 exposed at the bottom of the second recess opening portion is lower than that of the AlGaAs electron supply layer (upper layer) 5 of the conventional field effect transistor shown in FIG. 5, the field effect transistor according to the third embodiment stably operates against external conditions such as temperature change and light radiation. In addition, the conduction band energy discontinuity between AlGaInP and InGaAs is larger than that between InGaP and InGaAs, the field effect transistor according to the third embodiment can supply a larger drain current than the field effect transistor according to the second embodiment.

(Fourth Embodiment)

Figure 4:
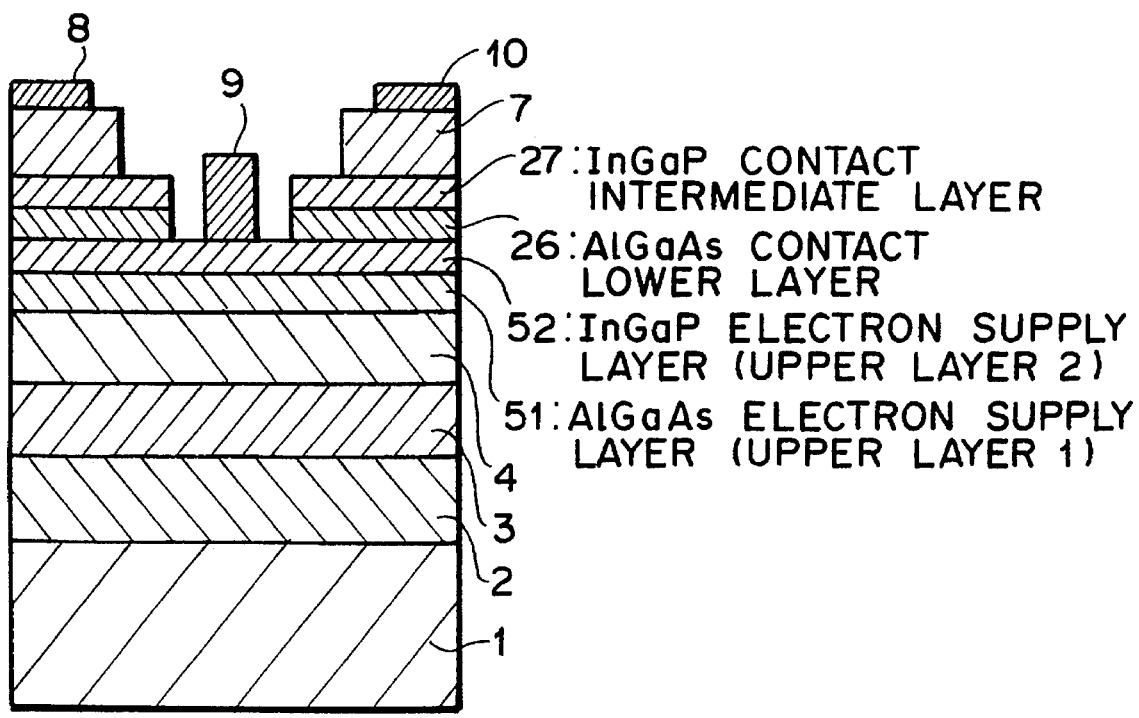
FIG. 4 is a sectional view showing the structure of a field effect transistor according to a fourth embodiment of the present invention.

FIG. 4 is a sectional view showing the structure of a field effect transistor according to a fourth embodiment of the present invention. For simplicity, in FIG. 4, similar portions to those in FIG. 1 are denoted by similar reference numerals and the detailed description thereof is omitted. The field effect transistor according to the fourth embodiment of the present invention (shown in FIG. 4) has the same structure as the field effect transistor according to the first embodiment of the present invention (shown in FIG. 1) except for the following points. In the fourth embodiment, a laminate structure of an AlGaAs electron supply layer (upper layer 1) 51 doped with n-type impurities entirely or locally in the direction of the thickness thereof and an InGaP electron supply layer (upper layer 2) 52 doped with n-type impurities entirely or locally in the direction of the thickness thereof is formed instead of the AlGaAs electron supply layer (upper layer) 5 of the first embodiment.

In addition, a laminate structure of an InGaP contact intermediate layer 27 doped with n-type impurities and an AlGaAs contact lower layer 26 doped with n-type impurities is formed instead of the InGaP contact layer 16. In this case, the AlGaAs electron supply layer (upper layer 1) 51 is formed in contact with the channel layer 4. The InGaP contact intermediate layer 27 is formed in contact with the GaAs contact upper layer 7. The composition x of In of each of the InGaP electron supply layer (upper layer 2) 52 and the InGaP contact intermediate layer 27 may be 0.49 that accords with the lattice of the semiinsulating GaAs substrate 1.

However, the composition x is not limited to such a value. The impurities may be equally doped in the InGaP electron supply layer (upper layer 2) 52 and the AlGaAs electron supply layer (lower layer) 3 as an impurity profile. However, the present invention is not limited to such an impurity profile. Instead, the impurities doped in the InGaP electron supply layer (upper layer 2) 52 and the AlGaAs electron supply layer (lower layer) 3 may be varied in the direction of the depth or in step shape. Alternatively, the impurity concentration profiles may be planar-doped.

Such a field effect transistor can be fabricated in the following manner. By for example metal organic vapor phase epitaxial growth method (MOVPE), an undoped GaAs layer as a buffer type semiconductor layer 2 for 300 nm, an undoped $Al_{0.2}Ga_{0.8}As$ layer for 200 nm, an n-type $Al_{0.2}Ga_{0.8}As$ electron supply layer (lower layer) 3 doped with Si of approximately $2.5\times10^{18}$ cm$^{-3}$ for 6 nm, an undoped $Al_{0.2}Ga_{0.8}As$ spacer layer for 1.5 nm, an undoped $In_{0.2}Ga_{0.8}As$ channel layer 4 for 13 nm, an n-type $Al_{0.2}Ga_{0.8}As$ layer 5 doped with Si of approximately $2.5\times10^{18}$ cm$^{-3}$ for 10 nm, an n-type $In_{0.49}Ga_{0.51}P$ layer doped with Si of approximately $2.5\times10^{18}$ cm$^{-3}$ for 4 nm (as an InGaP electron supply layer (upper layer 2) 52), an undoped $In_{0.49}Ga_{0.51}P$ (Schottky) layer for 20 nm, an n-type $Al_{0.2}Ga_{0.8}As$ contact lower layer 26 doped with Si of approximately $2\times10^{17}$ cm$^{-3}$ for 20 nm, an n-type $In_{0.49}Ga_{0.51}P$ contact intermediate layer 27 doped with Si of approximately $2\times10^{17}$ cm$^{-3}$ for 20 nm, and an n-type GaAs contact upper layer 7 doped with Si of approximately $3\times10^{18}$ cm$^{-3}$ for 80 nm are grown on a semiinsulating GaAs substrate in succession. In this case, even if the two undoped $Al_{0.2}Ga_{0.8}As$ spacer layers that are spaced apart by the undoped $In_{0.2}Ga_{0.8}As$ channel layer are omitted, the fundamental operation of the FET is not affected.

In addition, the undoped $In_{0.49}Ga_{0.51}P$ (Schottky) layer formed as a part of the InGaP electron supply layer (upper layer 2) 52 improves the breakdown voltage of the gate electrode 9. Thereafter, the portion other than the first opening recess portion is masked and the n-type GaAs contact upper layer 7 is etched out with for example a $H_2SO_4$—$H_2O_2$—$H_2O$ type etching solution so as to form a first recess opening portion. At this point, since the InGaP layer 27 is hardly etched out with the etching solution, when the surface of the n-type $In_{0.49}Ga_{0.51}P$ contact intermediate layer 27 is exposed in the first opening recess portion, the etching in the direction of the depth of the recess opening portion that pierces through the n-type GaAs contact upper layer 7 is automatically stopped.

Thereafter, the inside of the first recess opening portion is etched out with for example a HCl—$H_2O$ type etching solution so as to form a second recess opening portion that is narrower than the first recess opening portion. At this point, since the GaAs layer 7 or the AlGaAs layer 26 is hardly etched out with this etching solution, when the surface of the n-type $Al_{0.2}Ga_{0.8}As$ contact lower layer 26 is exposed, the etching in the direction of the depth of the second recess opening portion that pierces through the n-type $In_{0.49}Ga_{0.51}P$ contact intermediate layer 27 is automatically stopped.

Thereafter, the second recess opening portion that pierces through the n-type $Al_{0.2}Ga_{0.8}As$ contact lower layer 26 is continuously etched out with for example a $H_2SO_4$—$H_2O_2$—$H_2O$ type etching solution. At this point, since the InGaP layer 52 or the InGaP layer 27 is hardly etched out with the etching solution, when the surface of the undoped $In_{0.49}Ga_{0.51}P$ (Schottky) layer 52 is exposed, the etching in the direction of the depth of the recess opening portion that pierces through the n-type $Al_{0.2}Ga_{0.8}As$ contact lower layer 26 is automatically stopped. Thereafter, a gate electrode 9 composed of for example aluminum (Al) is formed on the surface of the undoped $In_{0.49}Ga_{0.51}P$ (Schottky) layer 52 exposed at the bottom of the second recess opening portion. Last, a source electrode 8 and a drain electrode 10 that are composed of for example gold germanium/nickel (AuGe/Ni) are formed on the two surface portions of the n-type GaAs contact upper layer 7 that are spaced apart by the gate electrode 9 and the first recess opening portion. Thereafter, ohmic contacts are formed by heat treatment at a temperature of approximately 420° C.

Since the field effect transistor according to the fourth embodiment of the present invention has the double-recess structure, it provides both a high gate breakdown voltage and large maximum drain current at the same time. In addition, since the field effect transistor according to the fourth embodiment has a higher process tolerance than the conventional field effect transistor shown in FIG. 5, the productivity and yield of the device can be remarkably improved.

Moreover, since the AlGaAs 51 doped with donor impurities and the GaAs 4 (or InGaAs) channel layer that is not intentionally doped with impurities (or that is doped therewith at satisfactorily low concentration) are formed on the InGaP layer 52, a relatively larger value (for example, 0.3 eV) can be designated the discontinuous amount of the conduction band energy. As a result, the concentration of two-dimensional electron gas can be increased.

Thus, the field effect transistor according to the fourth embodiment can be widely used in a variety of applications from analog applications to digital applications such as low noise amplifier in microwave band and millimeter-wave band, wide band linear amplifier, high power amplifier, and oscillator for x- and ku-band. Moreover, since the trap concentration on the surface and in the bulk of the InGaP electron supply layer (upper layer 2) 52 exposed at the bottom of the second recess opening portion is lower than that of the AlGaAs electron supply layer (upper layer) 5 of the conventional field effect transistor shown in FIG. 5, the field effect transistor according to the fourth embodiment stably operates against external conditions such as temperature change and light radiation.

Although the present invention has been shown and described with respect to best mode embodiments thereof, it should be understood by those skilled in the art that the foregoing and various other changes, omissions, and additions in the form and detail thereof may be made therein without departing from the spirit and scope of the present invention.

What is claimed is:

1. A field effect transistor, comprising:

a first semiconductor layer composed of GaAs or InGaAs that is intentionally undoped with impurities or that is doped with impurities at satisfactorily low concentration;

a second semiconductor layer that is in contact with said first semiconductor layer and that is composed of AlGaAs doped with n-type impurities entirely or locally in the direction of the thickness thereof;

a third semiconductor layer that is in contact with said second semiconductor layer and that is composed of InGaP doped with n-type impurities;

a fourth semiconductor layer that is in contact with said third semiconductor layer and that is composed of GaAs doped with n-type impurities;

a first recess opening portion that pierces through said fourth semiconductor layer;

a second recess opening portion that is formed in said first recess opening portion and that pierces through said third semiconductor layer;

a gate electrode formed on the surface of said second semiconductor layer exposed at the bottom of said second recess opening portion; and a source electrode and a drain electrode that are formed on said fourth semiconductor layer and that are spaced apart by said first recess opening portion.

2. The field effect transistor as set forth in claim 1, wherein the concentration of the n-type impurities doped in said third semiconductor layer is lower than the concentration of the n-type impurities doped in said fourth semiconductor layer.

3. The field effect transistor as set forth in claim 1, wherein the first recess opening portion is formed by a first etching solution that is of a $H_2SO_4$—$H_2O_2$—$H_2O$ type and the second recess opening portion is formed by a second etching solution that is of a HCl—$H_2O$ type.

4. The field effect transistor as set forth in claim 1, wherein the source electrode and the drain electrode are formed on the upper surface of said GaAs contact layer and ohmic contacts are formed at said source and drain electrode by heat treatment.

5. A field effect transistor, comprising:

a first semiconductor layer composed of GaAs or InGaAs that is intentionally undoped with impurities or that is doped with impurities at satisfactorily low concentration;

a second semiconductor layer that is in contact with said first semiconductor layer and that is composed of InGaP doped with n-type impurities entirely or locally in the direction of the thickness thereof;

a third semiconductor layer that is in contact with said second semiconductor layer and that is composed of AlGaAs doped with n-type impurities;

a fourth semiconductor layer that is in contact with said third semiconductor layer and that is composed of InGaP doped with n-type impurities;

a fifth semiconductor layer that is in contact with said fourth semiconductor layer and that is composed of GaAs doped with n-type impurities;

a first recess opening portion that pierces through said fifth semiconductor layer;

a second recess opening portion that is formed in said first recess opening portion and that pierces through said fourth semiconductor layer and said third semiconductor layer;

a gate electrode formed on the surface of said second semiconductor layer exposed at the bottom of said second recess opening portion; and a source electrode and a drain electrode that are formed on said fifth semiconductor layer and that are spaced apart by said first recess opening portion.

6. The field effect transistor as set forth in claim 5, wherein the concentration of the n-type impurities doped in each of said third semiconductor layer and said fourth semiconductor layer is lower than the concentration of the n-type impurities doped in said fifth semiconductor layer.

7. The field effect transistor as set forth in claim 5, wherein the first recess opening portion is formed by a first etching solution that is of a $H_2SO_4$—$H_2O_2$—$H_2O$ type and the second recess opening portion is formed by a second etching solution that is of a HCl—$H_2O$ type.

8. The field effect transistor as set forth in claim 5, wherein the source electrode and the drain electrode are formed on the upper surface of said GaAs contact layer and ohmic contacts are formed at said source and drain electrode by heat treatment.

9. A field effect transistor, comprising:

a first semiconductor layer composed of GaAs or InGaAs that is intentionally undoped with impurities or that is doped with impurities at satisfactorily low concentration;

a second semiconductor layer that is in contact with said first semiconductor layer and that is composed of AlGaInP doped with n-type impurities entirely or locally in the direction of the thickness thereof;

a third semiconductor layer that is in contact with said second semiconductor layer and that is composed of AlGaAs doped with n-type impurities;

a fourth semiconductor layer that is in contact with said third semiconductor layer and that is composed of InGaP doped with n-type impurities;

a fifth semiconductor layer that is in contact with said fourth semiconductor layer and that is composed of GaAs doped with n-type impurities;

a first recess opening portion that pierces through said fifth semiconductor layer;

a second recess opening portion that is formed in said first recess opening portion and that pierces through said fourth semiconductor layer and said third semiconductor layer;

a gate electrode formed on the surface of said second semiconductor layer exposed at the bottom of said second recess opening portion; and a source electrode and a drain electrode that are formed on said fifth semiconductor layer and that are spaced apart by said first recess opening portion.

10. The field effect transistor as set forth in claim 9, wherein the concentration of the n-type impurities doped in each of said third semiconductor layer and said fourth semiconductor layer is lower than the concentration of the n-type impurities doped in said fifth semiconductor layer.

11. The field effect transistor as set forth in claim 9, wherein the first recess opening portion is formed by a first etching solution that is of a $H_2SO_4$—$H_2O_2$—$H_2O$ type and the second recess opening portion is formed by a second etching solution that is of a HCl—$H_2O$ type.

12. The field effect transistor as set forth in claim 9, wherein the source electrode and the drain electrode are formed on the upper surface of said GaAs contact layer and ohmic contacts are formed at said source and drain electrode by heat treatment.

13. A field effect transistor, comprising:

a first semiconductor layer composed of GaAs or InGaAs that is intentionally undoped with impurities or that is doped with impurities at satisfactorily low concentration;

a second semiconductor layer that is in contact with said first semiconductor layer and that is composed of AlGaAs doped with n-type impurities entirely or locally in the direction of the thickness thereof;

a third semiconductor layer that is in contact with said second semiconductor layer and that is composed of InGaP doped with n-type impurities;

a fourth semiconductor layer that is in contact with said third semiconductor layer and that is composed of AlGaAs doped with n-type impurities;

a fifth semiconductor layer that is in contact with said fourth semiconductor layer and that is composed of InGaP doped with n-type impurities;

a sixth semiconductor layer that is in contact with said fifth semiconductor layer and that is composed of GaAs doped with n-type impurities;

a first recess opening portion that pierces through said sixth semiconductor layer;

a second recess opening portion that is formed in said first recess opening portion and that pierces through said fifth semiconductor layer and said fourth semiconductor layer;

a gate electrode formed on the surface of said third semiconductor layer exposed at the bottom of said second recess opening portion; and a source electrode and a drain electrode that are formed on said sixth semiconductor layer and that are spaced apart by said first recess opening portion.

14. The field effect transistor as set forth in claim 13, wherein the concentration of the n-type impurities doped in each of said fourth semiconductor layer and said fifth semiconductor layer is lower than the concentration of the n-type impurities doped in said sixth semiconductor layer.

15. The field effect transistor as set forth in claim 13, wherein the first recess opening portion is formed by a first etching solution that is of a $H_2SO_4$—$H_2O_2$—$H_2O$ type and the second recess opening portion is formed by a second etching solution that is of a HCl—$H_2O$ type.

16. The field effect transistor as set forth in claim 13, wherein the source electrode and the drain electrode are formed on the upper surface of said GaAs contact layer and ohmic contacts are formed at said source and drain electrode by heat treatment.

* * * * *